(12) United States Patent
Kim et al.

(10) Patent No.: US 11,594,169 B2
(45) Date of Patent: Feb. 28, 2023

(54) GATE DRIVING CIRCUIT AND ELECTROLUMINESCENT DISPLAY DEVICE USING THE SAME

(71) Applicant: LG Display Co., Ltd., Seoul (KR)

(72) Inventors: Minsu Kim, Goyang-si (KR); Miso Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/561,192

(22) Filed: Dec. 23, 2021

(65) Prior Publication Data
US 2022/0208075 A1 Jun. 30, 2022

(30) Foreign Application Priority Data
Dec. 29, 2020 (KR) .................. 10-2020-0186629

(51) Int. Cl.
G09G 3/30 (2006.01)
(52) U.S. Cl.
CPC ....... *G09G 3/30* (2013.01); *G09G 2310/0267* (2013.01)
(58) Field of Classification Search
CPC .................. G09G 3/30; G09G 2310/0267
See application file for complete search history.

(56) References Cited

U.S. PATENT DOCUMENTS

2017/0116926 A1* 4/2017 Bong ............... G09G 3/3266
2019/0066604 A1* 2/2019 Kong ............... G09G 3/3266

FOREIGN PATENT DOCUMENTS

KR 10-2017-0002755 A 1/2017

\* cited by examiner

*Primary Examiner* — Towfiq Elahi
(74) *Attorney, Agent, or Firm* — Seed IP Law Group LLP

(57) ABSTRACT

An electroluminescent display device includes a pixel circuit having transistors, and a gate driving circuit providing an emission signal, a first scan signal, and a second scan signal to the pixel circuit. The gate driving circuit includes an emission signal generating circuit for applying the emission signal to a gate electrode of at least one of the transistors, a first scan signal generating circuit for applying the first scan signal to a gate electrode of at least one of the transistors, and a second scan signal generating circuit for applying the second scan signal to a gate electrode of at least one of the transistors. The first scan signal generating circuit receives the emission signal and a voltage of a QB node of the second scan signal generating circuit, and the emission signal generating circuit and the first scan signal generating circuit include an n-type transistor and a p-type transistor.

20 Claims, 9 Drawing Sheets

GATE DRIVING CIRCUIT AND ELECTROLUMINESCENT DISPLAY DEVICE USING THE SAME

CROSS-REFERENCE TO RELATED APPLICATIONS

This application claims the benefit of and priority to Korean Patent Application No. 10-2020-0186629 filed on Dec. 29, 2020 in the Republic of Korea, the entire contents of which are hereby expressly incorporated by reference into the present application.

BACKGROUND

Technical Field

The present disclosure relates to a simplified gate driving circuit and an electroluminescent display device using the same.

Description of the Related Art

In accordance with the development of information technology, the market for display devices that are connection media between users and information, is growing. Accordingly, the use of various types of display devices such as an electroluminescent display device, a liquid crystal display device, an organic light emitting display device, and a quantum dot display device is increasing.

Among them, the electroluminescent display device has advantages in terms of a fast response speed, high luminous efficiency, and a large viewing angle. In general, the electroluminescent display device applies a data voltage to a gate electrode of a driving transistor using a transistor turned on by a scan signal, and charges the data voltage supplied to the driving transistor in a storage capacitor. Then, the data voltage charged in the storage capacitor is output using an emission signal so that light emitting elements emit light. The light emitting elements may include an organic light emitting element, an inorganic light emitting element, and a quantum dot element.

In the electroluminescent display device, pixels each including the light emitting element are arranged in a matrix form and luminance of the pixels is adjusted according to a gray level of video data.

Each of the pixels may include the light emitting element, a driving transistor for controlling a driving current flowing through the light emitting element according to a gate-source voltage, and at least one switching transistor for programming the gate-source voltage of the driving transistor.

As the electroluminescent display device continues to be driven, a hysteresis phenomenon in which a threshold voltage Vth of the driving transistor changes occurs. In order to alleviate the hysteresis phenomenon of the driving transistor, an on-bias stress may be applied to the driving transistor. A gate signal is required to control the switching transistor for applying on-bias stress to the driving transistor.

In addition, to periodically reset a voltage applied to an anode, which determines a degree of light emission of the light emitting element, a switching transistor connected to the anode may be provided.

BRIEF SUMMARY

The inventors have realized that, because a gate driving circuit includes a separate gate signal generating circuit to apply gate signals to switching transistors, the gate driving circuit becomes complicated, a bezel of the electroluminescent display device increases, and driving power consumption thereof may increase.

The gate driving circuit is attached to a display panel in the form of a chip on film or chip on glass, or may be implemented in the form of a gate-in-panel (hereinafter, referred to as GIP) that is formed by a combination of thin film transistors in a bezel area which is a non-display area of the display panel. The gate driving circuit in the form of GIP includes gate signal generating circuits corresponding to the number of gate lines, and each gate signal generating circuit outputs a gate signal that is supplied to the gate line corresponding thereto on a one-to-one basis. The gate line supplies a gate signal to a pixel array disposed in a display area, so that a light emitting element can emit light. Accordingly, as the number of gate signals to be supplied to the pixel array increases, a configuration of the gate driving circuit is complicated and has a large area, which may increase a bezel of an electroluminescent display device.

In addition, as described above, in order to apply on-bias stress to the pixel array and to apply a constant voltage to an anode of the light emitting element, the configuration of the gate driving circuit may become complicated and the bezel may be increased.

Accordingly, a technical feature of an embodiment of the present disclosure is to provide a gate driving circuit allowing for a reduction in arrangement area of the gate driving circuit by simplifying the gate driving circuit, and an electroluminescent display device using the same.

Technical features of the present disclosure are not limited to the above-mentioned technical features, and other technical features, which are not mentioned above, can be clearly understood by those skilled in the art from the following description.

An electroluminescent display device according to an embodiment of the present disclosure includes a pixel circuit implemented with a plurality of transistors and a gate driving circuit providing an emission signal, a first scan signal, and a second scan signal to the pixel circuit. The gate driving circuit includes an emission signal generating circuit for applying the emission signal to a gate electrode of at least one of the plurality of transistors, a first scan signal generating circuit for applying the first scan signal to a gate electrode of at least one of the plurality of transistors, and a second scan signal generating circuit for applying the second scan signal to a gate electrode of at least one of the plurality of transistors. The first scan signal generating circuit receives the emission signal and a voltage of a second QB node of the second scan signal generating circuit, and the emission signal generating circuit and the first scan signal generating circuit include an n-type transistor and a p-type transistor. Accordingly, a bezel of the electroluminescent display device may be reduced by simplifying the gate driving circuit.

A gate driving circuit according to an embodiment of the present disclosure includes a first pull-down unit controlled by a Q node; a first pull-up unit controlled by a first QB node, a second pull-down unit controlled by an emission signal and a second QB node of a second scan signal generating circuit, a second pull-up unit controlled by the emission signal and the second QB node of the second scan signal generating circuit, and a Q node inverter electrically connected to the Q node and the first QB node and configured to invert a voltage of the Q node. The first pull-down unit and the first pull-up unit output the emission signal, and the second pull-down unit and the second pull-up unit output a first scan signal. Accordingly, the gate driving circuit can be simplified.

Other detailed matters of the embodiments are included in the detailed description and the drawings.

According to embodiments of the present disclosure, by using an emission signal generating circuit that generates an emission signal without including a separate scan signal generating circuit that provides a scan signal for controlling a switching transistor for applying an on-bias stress of a driving transistor, a gate driving circuit can be simplified and a bezel of an electroluminescent display device can be reduced.

According to embodiments of the present disclosure, by implementing a gate driving circuit including both an n-type transistor and a p-type transistor, the gate driving circuit can be simplified and a bezel of an electroluminescent display device can be reduced.

According to embodiments of the present disclosure, by implementing a scan signal generating circuit using a voltage of a QB node included in other scan signal generating circuits, a gate driving circuit can be simplified and a bezel of an electroluminescent display device can be reduced.

The effects according to the present disclosure are not limited to the contents exemplified above, and more various effects are included in the present specification.

DETAILED DESCRIPTION

Figure 1:
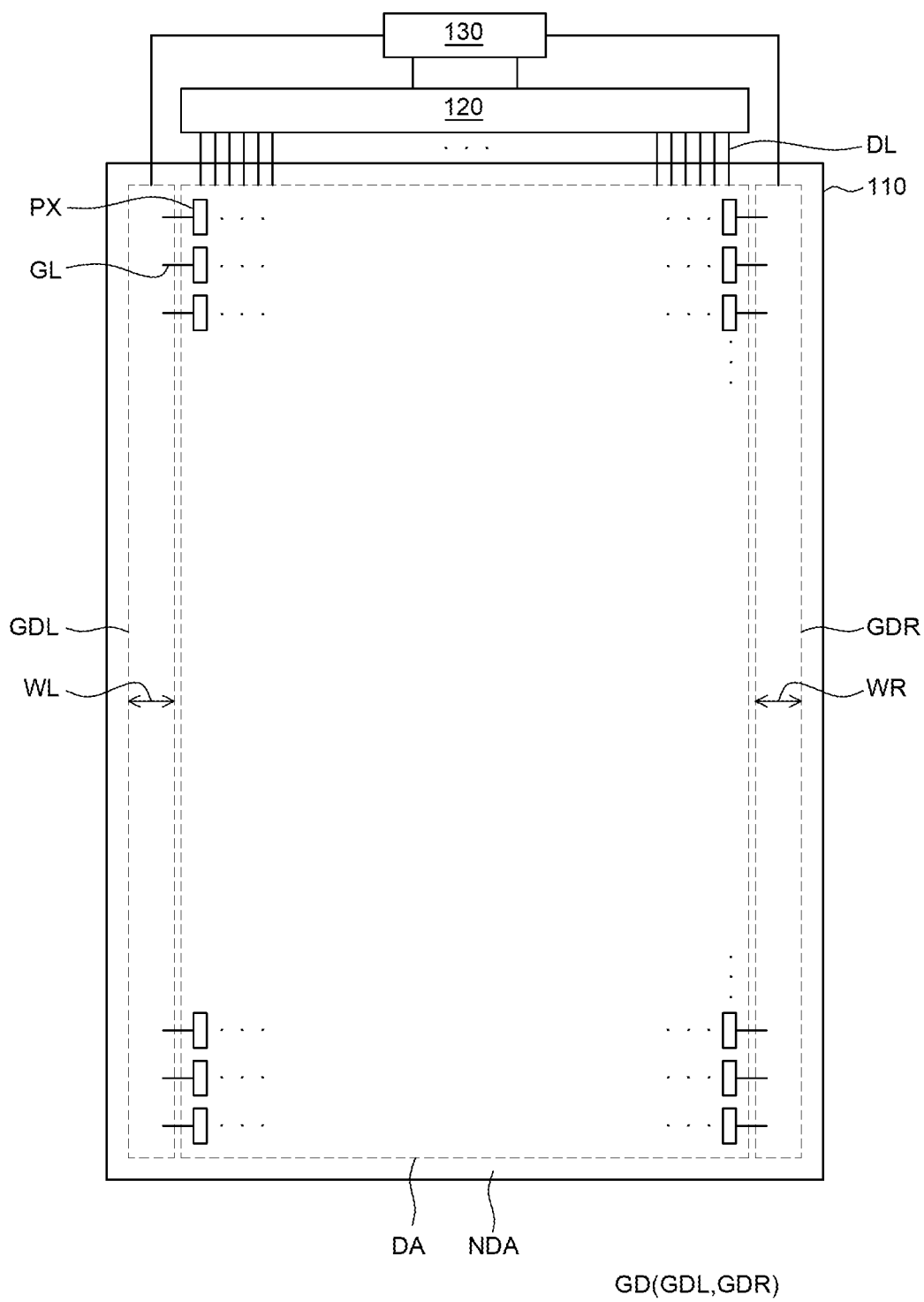
FIG. 1 is a block diagram of an electroluminescent display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, an electroluminescent display device according to embodiments of the present disclosure will be described in detail with reference to accompanying drawings.

FIG. 1 is a block diagram of an electroluminescent display device 100 according to an embodiment of the present disclosure.

Referring to FIG. 1, in the electroluminescent display device 100 according to an embodiment of the present disclosure, a plurality of data lines DL and a plurality of gate lines GL are disposed, and the electroluminescent display device 100 according to an embodiment of the present disclosure may include a display panel 110 in which a plurality of sub-pixels PX connected to the plurality of data lines DL and the plurality of gate lines GL are disposed, and a driving circuit providing driving signals to the display panel 110.

Although it is illustrated that the sub-pixels PX are disposed in a matrix form to form a pixel array, the present disclosure is not limited thereto and may be disposed in various forms.

The driving circuit may include a data driving circuit 120 that provides data signals to the plurality of data lines DL, a gate driving circuit GD that provides gate signals to the plurality of gate lines GL, a controller 130 that controls the data driving circuit 120 and the gate driving circuit GD, and the like. The controller 130 may be or include controller circuitry 130, and may be referred to as the controller circuitry 130.

The display panel 110 may include a display area DA where an image is displayed and a non-display area NDA that is an outer area of the display area DA. The plurality of sub-pixels PX may be disposed in the display area DA. The data lines DL providing data signals to the plurality of sub-pixels PX and the gate lines GL providing gate signals to the plurality of sub-pixels PX may be disposed in the display area DA.

The plurality of data lines DL disposed in the display area DA may extend to the non-display area NDA and may be electrically connected to the data driving circuit 120. The data line DL electrically connects the sub-pixel PX and the data driving circuit 120. The data line DL may be implemented as a single line, or may be implemented by connecting a plurality of lines through a contact hole using a link line.

The plurality of gate lines GL disposed in the display area DA may extend to the non-display area NDA and may be electrically connected to the gate driving circuit GD. The gate line GL electrically connects the sub-pixel PX and the gate driving circuit GD. Additionally, gate driving-related lines that are beneficial for the gate driving circuit GD to generate or drive gate signals may be disposed in the non-display area NDA. For example, the gate driving-related lines may include one or more high level gate voltage lines supplying a high level gate voltage to the gate driving circuit GD, one or more low level gate voltage lines supplying a low level gate voltage to gate driving circuits GD, a plurality of clock lines supplying a plurality of clock signals to the gate driving circuit GD, one or more start lines supplying one or more start signals to the gate driving circuit GD, and the like.

In the display panel 110, the plurality of data lines DL and the plurality of gate lines GL are disposed in the sub-pixels PX. For example, each of the plurality of data lines DL and the plurality of gate lines GL may be disposed in rows or columns. For convenience of explanation, it is assumed that the plurality of data lines DL are disposed in columns, and the plurality of gate lines GL are disposed in rows.

The controller 130 starts a scan according to a timing that is implemented in each frame, converts input image data input from the outside to match a data signal format used by the data driving circuit 120 and outputs a converted image data, and controls data driving at an appropriate time according to the scan.

The controller 130 receives, from the outside, timing signals including a vertical synchronization signal, a horizontal synchronization signal, an input data enable signal, and a clock signal together with the input image data. The controller 130 that has received the timing signals generates and outputs control signals for controlling the data driving circuit 120 and the gate driving circuit GD.

For example, the controller 130 outputs various data control signals including a source start pulse, a source sampling clock, a source output enable signal and the like to control the data driving circuit 120. The source start pulse controls a data sampling start timing of one or more data signal generating circuits constituting the data driving circuit 120. The source sampling clock is a clock signal that controls a sampling timing of data in each of the data signal generating circuits. The source output enable signal controls an output timing of the data driving circuit 120.

In addition, the controller 130 outputs gate control signals including a gate start pulse, a gate shift clock, a gate output enable signal and the like to control the gate driving circuit GD. The gate start pulse controls an operation start timing of one or more gate signal generating circuits constituting the gate driving circuit GD. The gate shift clock is a clock signal input to one or more gate signal generating circuits in common and controls a shift timing of a scan signal (or gate pulse). The gate output enable signal specifies timing information of the one or more gate signal generating circuits.

The controller 130 may be a timing controller used in a typical display device technology or may be a control device capable of further performing other control functions by including the timing controller. The timing controller may include timing controller circuitry, and may be referred to as timing controller circuitry.

The controller 130 may be implemented as a component separate from the data driving circuit 120, or may be implemented as a single integrated circuit by being integrated with the data driving circuit 120.

The data driving circuit 120 may be implemented by including one or more data signal generating circuits. The data signal generating circuit may include a shift register, a latch circuit, a digital-to-analog converter, an output buffer, and the like. The data signal generating circuit may further include an analog-to-digital converter in some cases.

The data driving circuit 120 may be connected to a bonding pad of the display panel 110 in a tape automated bonding (TAB) method, a chip on glass (COG) method, or a chip on panel (COP) method, may be directly disposed on the display panel 110, or may be integrated and disposed on the display panel 110. In addition, a plurality of data signal generating circuits may be implemented in a chip on film (COF) method in which they are mounted on a source-circuit film connected to the display panel 110.

The gate driving circuit GD sequentially supplies scan signals to the plurality of gate lines GL to thereby drive the sub-pixels PX connected to the plurality of gate lines GL. The gate driving circuit GD may include a shift register, a level shifter, and the like.

The gate driving circuit GD may be connected to a bonding pad of the display panel 110 in a tape automated bonding (TAB) method, a chip on glass (COG) method, or a chip on panel (COP) method, or may be implemented as a GIP type and disposed to be integrated in the display panel 110. In addition, a plurality of the gate signal generating circuits may be implemented in a chip on film (COF) method in which they are mounted on a gate-circuit film connected to the display panel 110. Hereinafter, for convenience of explanation, a case in which the gate driving circuit GD includes a plurality of gate signal generating circuits, and the plurality of gate signal generating circuits are implemented in a GIP type and disposed in the non-display area NDA of the display panel 110 is illustrated as an example.

The gate driving circuit GD sequentially supplies scan signals of a transistor turn-on voltage or a transistor turn-off voltage to the plurality of gate lines GL according to the control of the controller 130. When a signal is provided to a specific gate line by the gate driving circuit GD, the data driving circuit 120 converts image data received from the controller 130 into a data signal in an analog format and supplies it to the plurality of data lines DL.

The data driving circuit 120 may be located on one side of the display panel 110. For example, it may be on an upper side, a lower side, a left side, or a right side of the display panel 110. Also, the data driving circuit 120 may be located on both sides of the display panel 110 according to a driving method, a panel design method, and the like. For example, it may be on upper and lower sides, or left and right sides of the display panel 110.

The gate driving circuit GD may be located on one side of the display panel 110. For example, it may be on the upper side, the lower side, the left side, or the right side of the display panel 110. Also, the gate driving circuit GD may be located on both sides of the display panel 110 according to a driving method, a panel design method, and the like. For example, it may be on the upper and lower sides of the display panel 110, or the left and right sides of the display panel 110.

Hereinafter, a case in which the data driving circuit 120 is positioned on the upper side of the display panel 110 and the gate driving circuit GD is positioned on both the left side and the right side of the display panel 110 is described as an example. In this case, in the display panel 110, the gate driving circuit GD includes a first gate driving circuit GDL located on the left side of the display panel 110 and a second gate driving circuit GDR located on the right side of the display panel 110. A width of an area occupied by the first gate driving circuit GDL may be referred to as a first width WL, and a width of an area occupied by the second gate driving circuit GDR may be referred to as a second width WR. A size of a bezel of the electroluminescent display device 100 may vary according to the respective widths WL and WR of the first gate driving circuit GDL and the second gate driving circuit GDR. Since an aesthetic effect and convenience of user's viewing of the electroluminescent display device 100 increases as the bezel is smaller, there is a need to simplify the gate driving circuit GD in order to reduce the bezel.

The plurality of gate lines GL disposed on the display panel 110 may include a plurality of scan lines, a plurality of emission control lines, and the like. The plurality of scan lines and the plurality of emission control lines are lines that transmit different types of gate signals to respective gate nodes of different transistors.

Accordingly, the gate driving circuit GD includes a plurality of scan driving circuits for outputting scan signals to the plurality of scan lines that are one type of the gate lines GL, and a plurality of emission driving circuits for outputting emission signals to the plurality of emission control lines that are another type of the gate lines GL.

Figure 2A:
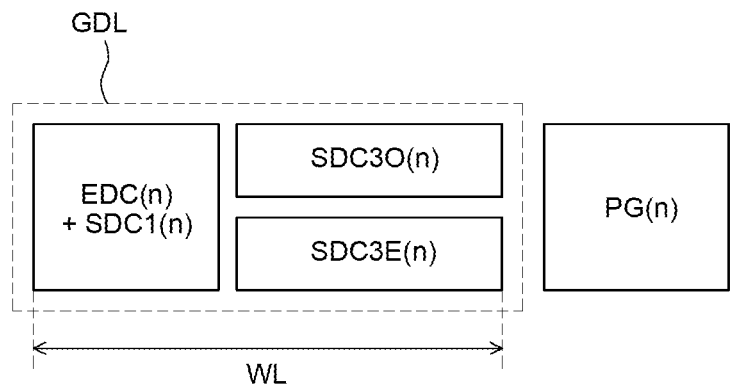
FIG. 2A is a block diagram illustrating a gate driving circuit disposed on a left side of the electroluminescent display device according to an embodiment of the present disclosure.
Figure 2B:
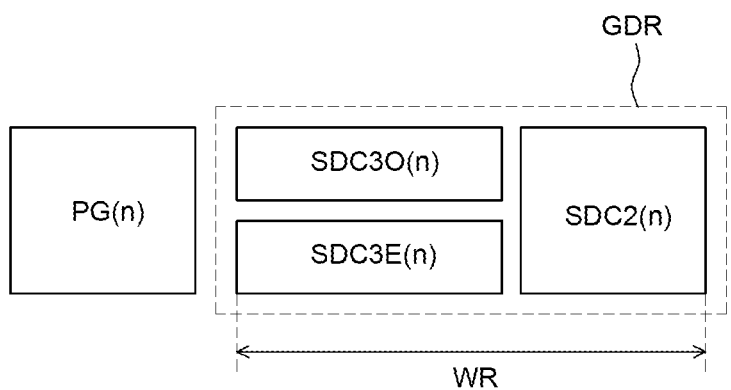
FIG. 2B is a block diagram illustrating a gate driving circuit disposed on a right side of the electroluminescent display device according to an embodiment of the present disclosure.

FIG. 2A is a block diagram illustrating the first gate driving circuit GDL disposed on the left side of the electroluminescent display device 100 according to an embodiment of the present disclosure. FIG. 2B is a block diagram illustrating the second gate driving circuit GDR disposed on the right side of the electroluminescent display device 100 according to an embodiment of the present disclosure.

The display area DA includes the plurality of sub-pixels PX, and displays an image based on a gray level displayed by each of the sub-pixels PX. The respective sub-pixels PX are connected to the data lines DL disposed along a column line and connected to the gate lines GL disposed along a row line. In this case, the sub-pixels PX located on the same row line are referred to as a pixel line PG, and the sub-pixels PX located on the same pixel line share the same gate line GL and receive a gate signal through the gate line GL. Accordingly, the sub-pixels PX connected to a first gate line may be referred to as a first pixel line, and the sub-pixels PX connected to an n-th gate line may be referred to as an n-th pixel line PG(n). When the number of pixel lines disposed in the display area DA is n, the first pixel line to the n-th pixel line are in synchronization with the gate signal generating circuits and sequentially driven. In this case, the gate driving circuit GD is composed of gate signal generating circuits corresponding to the number of the pixel lines.

As mentioned above, the display panel 110 includes the display area DA where an image is displayed based on the sub-pixels PX and the non-display area NDA where signal lines, driving circuits and the like are located and an image is not displayed.

The sub-pixel PX includes a light emitting element and a pixel circuit for controlling the amount of current applied to an anode of the light emitting element. The pixel circuit may include a driving transistor for controlling the amount of current so that a predetermined current or selected current can flow through the light emitting element. The light emitting element emits light in an emission period, and does not emit light in periods other than the emission period. In the periods other than the emission period, the pixel circuit may be initialized, the scan signal may be input to the pixel circuit, and programming period and pixel circuit compensation period may be conducted. For example, the pixel circuit compensation period may be a period for compensating a threshold voltage of the driving transistor. In the periods other than the emission period, the light emitting element should not emit light because a current capable of emitting light with a specific luminance is not constantly supplied. For example, in a method for making the light emitting element not emit light, an emission control transistor may be connected between the anode of the light emitting element and the driving transistor. The emission control transistor is connected to the emission control line and is controlled by an emission signal output from an emission signal generating circuit. In the emission period, the emission signal may be a turn-on voltage, and in the periods other than the emission period, the emission signal may be a turn-off voltage.

The gate signals for driving the sub-pixels PX included in the display panel 110 include scan signals and emission signals. Accordingly, the gate driving circuit GD may separately include the scan driving circuits that provide the scan signals and the emission driving circuits that apply the emission signals. The scan signals are applied to the pixel lines PG through the scan lines, and the emission signals are applied to the pixel lines PG through the emission control lines.

As described above, in order to apply on-bias stress to alleviate hysteresis of the driving transistor of the electroluminescent display device 100, a switching transistor connected to the driving transistor may be included. To this end, the gate driving circuit GD may include a separate gate signal generating circuit for controlling the switching transistor. In this case, the gate driving circuit GD includes a separate gate signal generating circuit for controlling the switching transistor that provides on-bias stress to the pixel circuit, so that the gate driving circuit GD becomes complicated and a bezel of the electroluminescent display device 100 may also be increased.

However, in the electroluminescent display device 100 according to an embodiment of the present disclosure, the bezel can be reduced by simplifying the separate gate signal generating circuit.

Accordingly, as shown in FIGS. 2A and 2B, the first gate driving circuit GDL that provides a gate signal to the n-th pixel line PG(n) and is disposed on the left side of the display area DA may include an odd-numbered third scan signal generating circuit SDC3O(n), an even-numbered third scan signal generating circuit SDC3E(n), a first scan signal generating circuit SDC1(n), and an emission signal generating circuit EDC(n).

The second gate driving circuit GDR that provides a gate signal to the n-th pixel line PG(n) and is disposed on the right side of the display area DA may include an odd-numbered third scan signal generating circuit SDC3O(n), an even-numbered third scan signal generating circuit SDC3E (n), and a second scan signal generating circuit SDC2(n).

A first scan signal that is provided to the switching transistor for controlling an on-bias stress of the driving transistor as described above is provided through the first scan signal generating circuit SDC1(n). The first scan signal generating circuit SDC1(n) may be implemented using an output signal of the emission signal generating circuit EDC (n), so that the first gate driving circuit GDL may be simplified. In this case, the first width WL of the first gate driving circuit GDL may be reduced by several tens of μm. Accordingly, a width of the bezel of the electroluminescent display device 100 may be reduced by several tens of μm.

Figure 3:
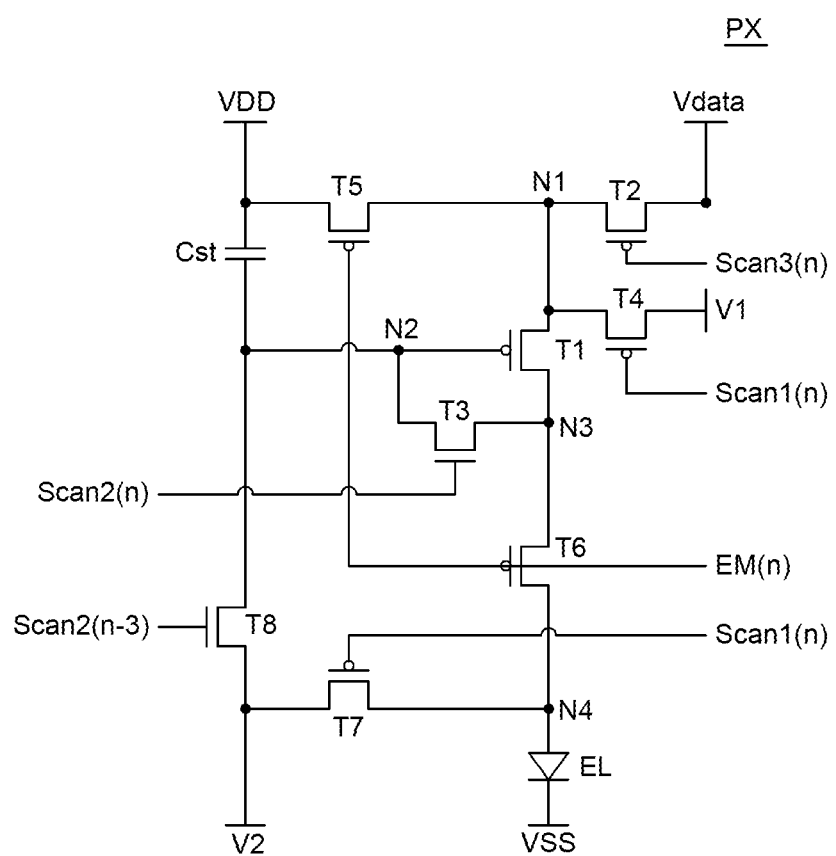
FIG. 3 is a circuit diagram illustrating a pixel circuit of the electroluminescent display device according to an embodiment of the present disclosure.
Figure 4:
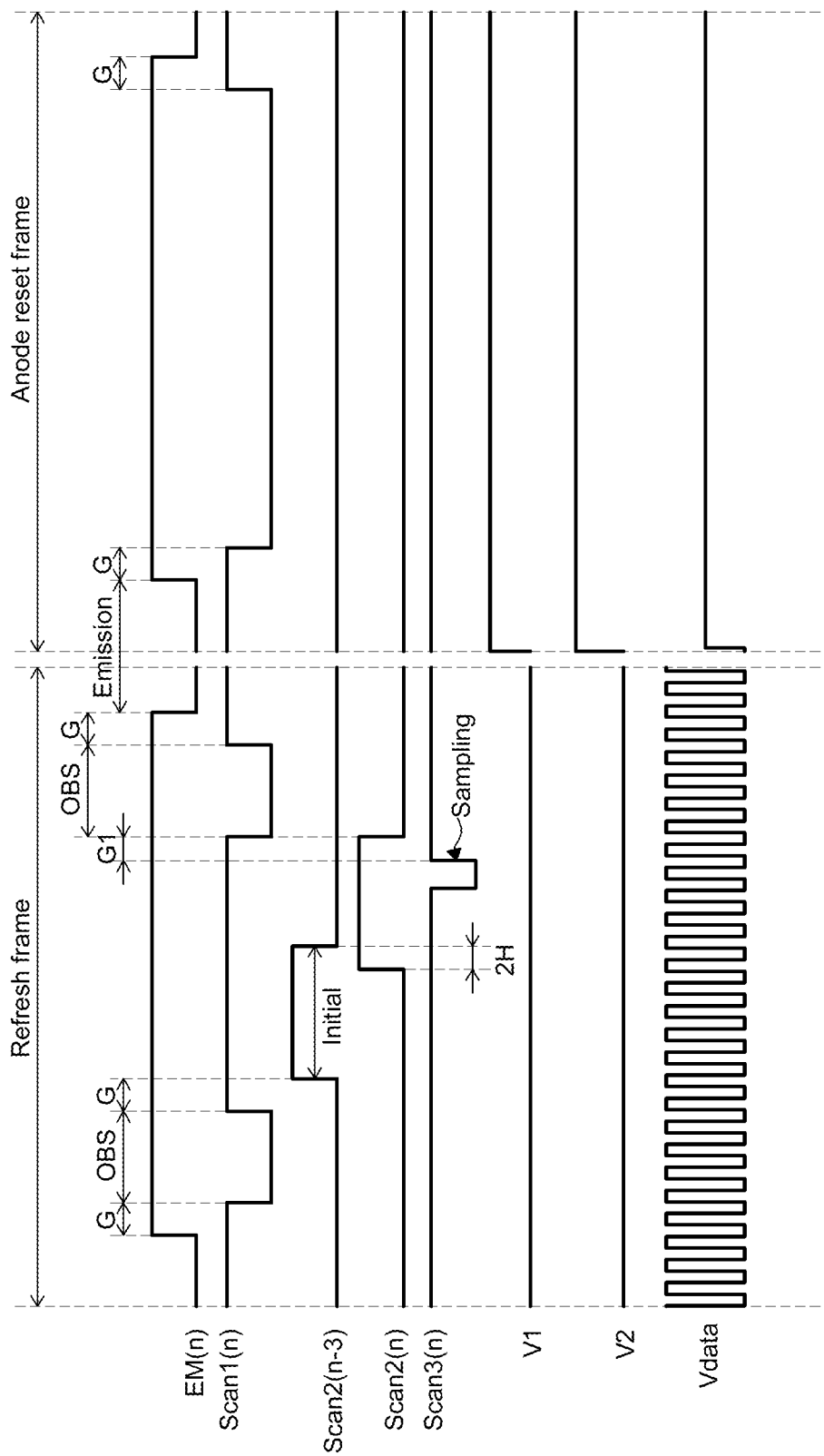
FIG. 4 is a waveform diagram of signals provided to the pixel circuit of FIG. 3.

FIG. 3 is a circuit diagram illustrating a pixel circuit of the electroluminescent display device 100 according to an embodiment of the present disclosure. FIG. 4 is a waveform diagram of signals provided to the pixel circuit of FIG. 3. The pixel circuit shown in FIG. 3 is described with the sub-pixels PX disposed on the n-th pixel line PG(n) as an example.

Each of the sub-pixels PX includes a light emitting element EL and a pixel circuit, and the pixel circuit includes a driving transistor T1, second to eighth transistors T2 to T8, and a storage capacitor Cst. The pixel circuit can be implemented with a plurality of transistors and a gate driving circuit providing an emission signal, a first scan signal, and a second scan signal to the pixel circuit. As an example, the transistors may include at least one n-type transistor and at least one p-type transistor. As an example, the first scan signal generating circuit and the emission signal generating circuit may be shared in an odd-numbered pixel circuit and an even-numbered pixel circuit.

The light emitting element EL emits light by a driving current supplied from the driving transistor T1. A multilayered organic compound layer is formed between an anode electrode and a cathode electrode of the light emitting element EL. The organic compound layer may include at least one hole transmit layer and at least one an electron transmit layer, and an emission layer. Here, the hole transmit layer is a layer that injects or transports holes to the emission layer, and may be, for example, a hole injection layer, a hole transmit layer, and an electron blocking layer. In addition, the electron transmit layer is a layer that injects or transmits electrons to the emission layer, and may be, for example, an electron transport layer, an electron injection layer, and a hole blocking layer. The anode electrode of the light emitting element EL is connected to a fourth node N4, and the cathode electrode of the light emitting element EL is connected to a line to which a low potential driving voltage VSS is provided.

The driving transistor T1 controls a driving current applied to the light emitting element EL according to a source-gate voltage Vsg. The driving transistor T1 may be a p-type MOSFET (PMOS) and may be implemented as a low-temperature polycrystalline silicon (LTPS) thin film transistor. In addition, a source electrode of the driving transistor T1 is connected to a first node N1, a gate electrode of the driving transistor T1 is connected to a second node N2, and a drain electrode of the driving transistor T1 is connected to a third node N3. The driving transistor T1 may be referred to as a first transistor.

The second transistor T2 applies a data voltage Vdata supplied from the data line to the first node N1 that is the source electrode of the driving transistor T1. The second transistor T2 may be a p-type MOSFET (PMOS) and may be implemented as a low-temperature polycrystalline silicon (LTPS) thin film transistor. The second transistor T2 includes a source electrode connected to the data line, a drain electrode connected to the first node N1, and a gate electrode connected to a third scan signal line that transmits a third scan signal Scan3(n). Accordingly, the second transistor T2 applies the data voltage Vdata supplied from the data line, to the first node N1 that is the source electrode of the driving transistor T1, in response to the third scan signal Scan3(n) of a low level which is a turn-on voltage.

A third transistor T3 diode-connects the gate electrode and the drain electrode of the driving transistor T1. The third transistor T3 may be an n-type MOSFET (NMOS) and may be implemented as an oxide thin film transistor in order to minimize or reduce a leakage current during a turn-off period. The third transistor T3 includes a drain electrode or source electrode connected to the third node N3, a source electrode or drain electrode connected to the second node N2, and a gate electrode connected to a second scan signal line that transmits a second scan signal Scan2(n). Accordingly, the third transistor T3 diode-connects the gate electrode and the drain electrode of the driving transistor T1 in response to the second scan signal Scan2(n) of a high level which is a turn-on voltage.

A fourth transistor T4 applies a first voltage V1 to the first node N1 that is the source electrode of the driving transistor T1. The fourth transistor T4 may be a p-type MOSFET (PMOS) and may be implemented as a low-temperature polycrystalline silicon (LTPS) thin film transistor. The fourth transistor T4 has a source electrode connected to a first voltage line for transmitting the first voltage V1, a drain electrode connected to the first node N1, and a gate electrode connected to a first scan signal line for transmitting a first scan signal Scan1(n). Accordingly, the fourth transistor T4 applies the first voltage V1 to the first node N1 that is the source electrode of the driving transistor T1, in response to the first scan signal Scan1(n) of a low level, which is the turn-on voltage.

A fifth transistor T5 applies a high potential driving voltage VDD to the first node N1 that is the source electrode of the driving transistor T1. The fifth transistor T5 may be a p-type MOSFET (PMOS) and may be implemented as a low-temperature polycrystalline silicon (LTPS) thin film transistor. The fifth transistor T5 includes a source electrode connected to a high potential driving voltage line that transmits the high potential driving voltage VDD, a drain electrode connected to the first node N1, and a gate electrode connected to an emission signal line that transmits an emission signal EM(n). Accordingly, the fifth transistor T5 applies the high potential driving voltage VDD to the first node N1 that is the source electrode of the driving transistor T1 in response to the emission signal EM(n) of a low level, which is the turn-on voltage.

A sixth transistor T6 forms a current path between the driving transistor T1 and the light emitting element EL. The sixth transistor T6 may be a p-type MOSFET (PMOS) and may be implemented as a low-temperature polycrystalline silicon (LTPS) thin film transistor. The sixth transistor T6 includes a source electrode connected to the third node N3, a drain electrode connected to the fourth node N4, and a gate electrode connected to the emission signal line that transmits the emission signal EM(n). The sixth transistor T6 forms a current path between the third node N3 that is the source electrode of the sixth transistor T6 and the fourth node N4 that is the drain electrode of the sixth transistor T6 in response to the emission signal EM(n). Accordingly, the sixth transistor T6 forms a current path between the driving transistor T1 and the light emitting element EL in response to the emission signal EM(n) of a low level, which is a turn-on voltage.

A seventh transistor T7 applies a second voltage V2 to the fourth node N4 that is an anode of the light emitting element EL. The seventh transistor T7 may be a p-type MOSFET (PMOS) and may be implemented as a low-temperature polycrystalline silicon (LTPS) thin film transistor. The seventh transistor T7 includes a source electrode connected to a second voltage line that transmits the second voltage V2, a drain electrode connected to the fourth node N4, and a gate electrode connected to the first scan signal line that transmits the first scan signal Scan1(n). Accordingly, the seventh transistor T7 applies the second voltage V2 to the fourth node N4 that is the anode of the light emitting element EL, in response to the first scan signal Scan1(n) of a low level, which is a turn-on voltage.

The eighth transistor T8 applies the second voltage V2 to the second node N2 that is the gate electrode of the driving transistor T1. The eighth transistor T8 may be an n-type MOSFET (NMOS) and may be implemented as an oxide thin film transistor in order to minimize or reduce a leakage current during a turn-off period. The eighth transistor T8 has a source electrode or a drain electrode connected to the second voltage line, the drain electrode or the source electrode connected to the second node N2, and a gate electrode connected to an (n-3)-th second scan signal line that transmits a second scan signal Scan2(n-3) which is provided to an (n-3)-th pixel line. Accordingly, the eighth transistor T8 applies the second voltage V2 to the second node N2 that is the gate electrode of the driving transistor T1, in response to the second scan signal Scan2(n-3) of a high level, which is a turn-on voltage.

The storage capacitor Cst maintains the data voltage Vdata stored in each of the sub-pixels PX during one frame. The storage capacitor Cst includes a first electrode connected to the second node N2 and a second electrode connected to the high potential driving voltage line that transmits the high potential driving voltage VDD. That is, one electrode of the storage capacitor Cst is connected to the gate electrode of the driving transistor T1, and the other electrode of the storage capacitor Cst is connected to the high potential driving voltage line that transmits the high potential driving voltage VDD.

Referring to FIGS. 3 and 4, driving of the sub-pixel PX of the electroluminescent display device 100 according to an embodiment of the present disclosure will be described as follows.

The electroluminescent display device 100 may be dividedly driven in a refresh frame and an anode reset frame. In the refresh frame, the data voltage Vdata is programmed in each sub-pixel PX, and the light emitting element EL emits light. The anode reset frame may be a vertical blank frame, and the anode electrode of the light emitting element EL is reset during the anode reset frame.

In the electroluminescent display device 100 according to an embodiment of the present disclosure, the refresh frame and the anode reset frame may include a plurality of on bias stress periods (OBS, hereinafter referred to as "stress periods"). The stress period OBS is a period in which bias stress is applied to the first node N1 that is the source electrode of the driving transistor T1. As shown in FIG. 4, during the stress periods OBS of the refresh frame and the anode reset frame, the first scan signal Scan1(n) is at a low level which is a turn-on voltage.

The stress period OBS may alleviate hysteresis of the driving transistor. The plurality of transistors may have hysteresis in which characteristics thereof in a current frame vary according to an operation state in a previous frame. For example, even when a data voltage of the same voltage level is supplied to the driving transistor T1, different levels of driving current may be generated according to the operating state in the previous frame. Accordingly, by performing an on-bias stress on the plurality of transistors, characteristics of the plurality of transistors, that is, a threshold voltage, may be initialized to a constant state. For example, by performing an on-bias stress on each of the plurality of sub-pixels PX, a specific transistor of each of the plurality of sub-pixels PX may be initialized to the same state, and in the next frame, light of the same luminance may be generated in all of the sub-pixels PX.

In the electroluminescent display device 100 according to the embodiment of the present disclosure, the refresh frame may be divided into an initial period Initial, a sampling period Sampling, and an emission period Emission. The initial period Initial is a period in which a voltage of the third node N3 that is the drain electrode of the driving transistor T1 is initialized. The sampling period Sampling is a period in which a threshold voltage Vth of the driving transistor T1 is sampled and the data voltage Vdata is programmed. The emission period Emission is a period in which the light emitting element EL emits light according to a driving current due to the source-gate voltage Vsg of the programmed driving transistor T1. And, as shown in FIG. 4, during the initial period Initial, the sampling period, and the emission period Emission of the refresh frame, the first scan signal Scan1(n) is at a high level.

Specifically, referring to FIGS. 3 and 4, during the stress periods OBS of the refresh frame, the first scan signal Scan1(n) is at a low level, which is a turn-on voltage. In the refresh frame including the plurality of stress periods OBS, the first scan signal Scan1 (n) may be a waveform including a plurality of pulses. In addition, a bias stress of the driving transistor T1 may be reduced by providing the first voltage V1 to the first node N1 that is the source node of the driving transistor T1 in the plurality of stress periods OBS. The first voltage V1 may be selected within a range of voltage that is sufficiently higher than an operating voltage of the light emitting element EL, and may be set to a voltage equal to or lower than the high potential driving voltage VDD. That is, an on bias stress may be applied to the first node N1 that is the source electrode of the driving transistor T1 during the stress period OBS to thereby decrease the source-drain voltage Vsd of the driving transistor T1. Accordingly, during the stress period OBS, an influence of hysteresis may be reduced by alleviating charge characteristics of a channel portion of the driving transistor T1 with the same voltage. In this case, the same voltage is a voltage applied to the source electrode of the driving transistor T1 during the stress period OBS.

In the electroluminescent display device 100 according to an embodiment of the present disclosure, the anode reset frame may include an anode reset period. In the anode reset period, the seventh transistor T7 is turned on by the first scan signal Scan1(n) and applies the second voltage V2 to the fourth node N4. That is, the anode electrode of the light emitting element EL is reset to the second voltage V2. In this case, the second voltage V2 may be adjusted to a specific level. The second voltage V2 is a voltage equal to or lower than the low potential driving voltage VSS and may maintain the same emission characteristics of the light emitting element EL in the refresh frame and the anode reset frame and prevent screen flicker. The anode reset period may also be included in the refresh frame.

During the initial period Initial of the refresh frame in the electroluminescent display device 100 according to an embodiment of the present disclosure, the second scan signal Scan2(n-3) provided to the (n-3)-th pixel line is at a high level, which is a turn-on voltage. Accordingly, the eighth transistor T8 is turned on and applies the second voltage V2 to the second node N2. As a result, the gate electrode of the driving transistor T1 is initialized to the second voltage V2. In the refresh frame, the second voltage V2 may be selected within a range of voltage sufficiently lower than the operating voltage of the light emitting element EL, and may be set to be equal to or lower than the low potential driving voltage VSS. A voltage level of the second voltage V2 in the anode reset frame in which the first scan signal Scan1(n) is at a low level and a voltage level of the second voltage V2 in the initial period Initial in which the second scan signal Scan2(n-3) is at a high level are different from each other.

Subsequently, during the sampling period Sampling of the refresh frame, the third scan signal Scan3(n) is at a low level, which is a turn-on voltage, and the second scan signal Scan2(n) is at a high level, which is a turn-on voltage. During the sampling period Sampling of the refresh frame, the third scan signal Scan3(n) is at a low level, which is a turn-on voltage, an odd-numbered third scan signal Scan3O(n) is at a low level, which is a turn-on voltage, and an even-numbered third scan signal Scan3E(n) is at a low level, which is a turn-on voltage.

Accordingly, during the sampling period Sampling, the second transistor T2 is turned on, and the data voltage Vdata is applied to the first node N1. In addition, as the third transistor T3 is also turned on, the driving transistor T1 is diode-connected and the gate electrode and the drain electrode of the driving transistor T1 are short-circuited so that the driving transistor T1 operates like a diode. In the sampling period Sampling, the driving transistor T1 is turned on and a current Ids flows between a source and a drain thereof. Since the gate electrode and the drain electrode of the driving transistor T1 are in a state of diode-connection, a voltage of the second node N2 rises until a gate-source voltage Vgs of the driving transistor T1 becomes the threshold voltage Vth, by the current flowing from the source electrode to the drain electrode. During the sampling period Sampling, the voltage of the second node N2 is charged with a voltage Vdata-|Vth| corresponding to a difference between the data voltage Vdata and the threshold voltage Vth of the driving transistor T1.

Subsequently, during the emission period Emission of the refresh frame, the emission signal EM(n) is at a low level, which is a turn-on voltage. Accordingly, the fifth transistor T5 is turned on and applies the high potential driving voltage VDD to the first node N1. In addition, the sixth transistor T6 is also turned on to form a current path between the third node N3 and the fourth node N4. As a result, a driving current Ioled generated through the source electrode and the drain electrode of the driving transistor T1 is applied to the light emitting element EL. During the emission period Emission, a relational expression for the driving current holed that flows through the light emitting element EL is as below Equation 1.

$$Ioled = k/2(Vgs + |Vth|)^2 = k/2(Vdata - VDD)^2 \qquad \text{Equation 1}$$

In Equation 1, k/2 represents a proportional constant determined by electron mobility, parasitic capacitance, and channel capacitance of the driving transistor T1.

As shown in Equation 1, a threshold voltage Vth component of the driving transistor T1 is erased in the relational expression of the driving current holed. This means that in the display device according to the present disclosure, the driving current holed does not change even if the threshold voltage Vth changes. As described above, the electroluminescent display device 100 according to the present disclosure can program the data voltage regardless of the amount of change in the threshold voltage Vth during the sampling period.

As described above, the anode electrode of the light emitting element EL is reset to the second voltage V2 in both the anode reset frame and the refresh frame.

As a result, the anode electrode of the light emitting element EL may be periodically reset over the refresh frame and the anode reset frame in the electroluminescent display device 100 according to the embodiment of the present disclosure. Accordingly, a continuous increase in voltage of the anode electrode of the light emitting element EL due to a leakage current is prevented even in driving at a low frequency, so that the anode electrode of the light emitting element EL can maintain a constant voltage level. Accordingly, even though a driving frequency is switched to a low frequency, a change in luminance of the electroluminescent display device 100 is minimized or reduced, so that image quality can be improved.

Figure 5:
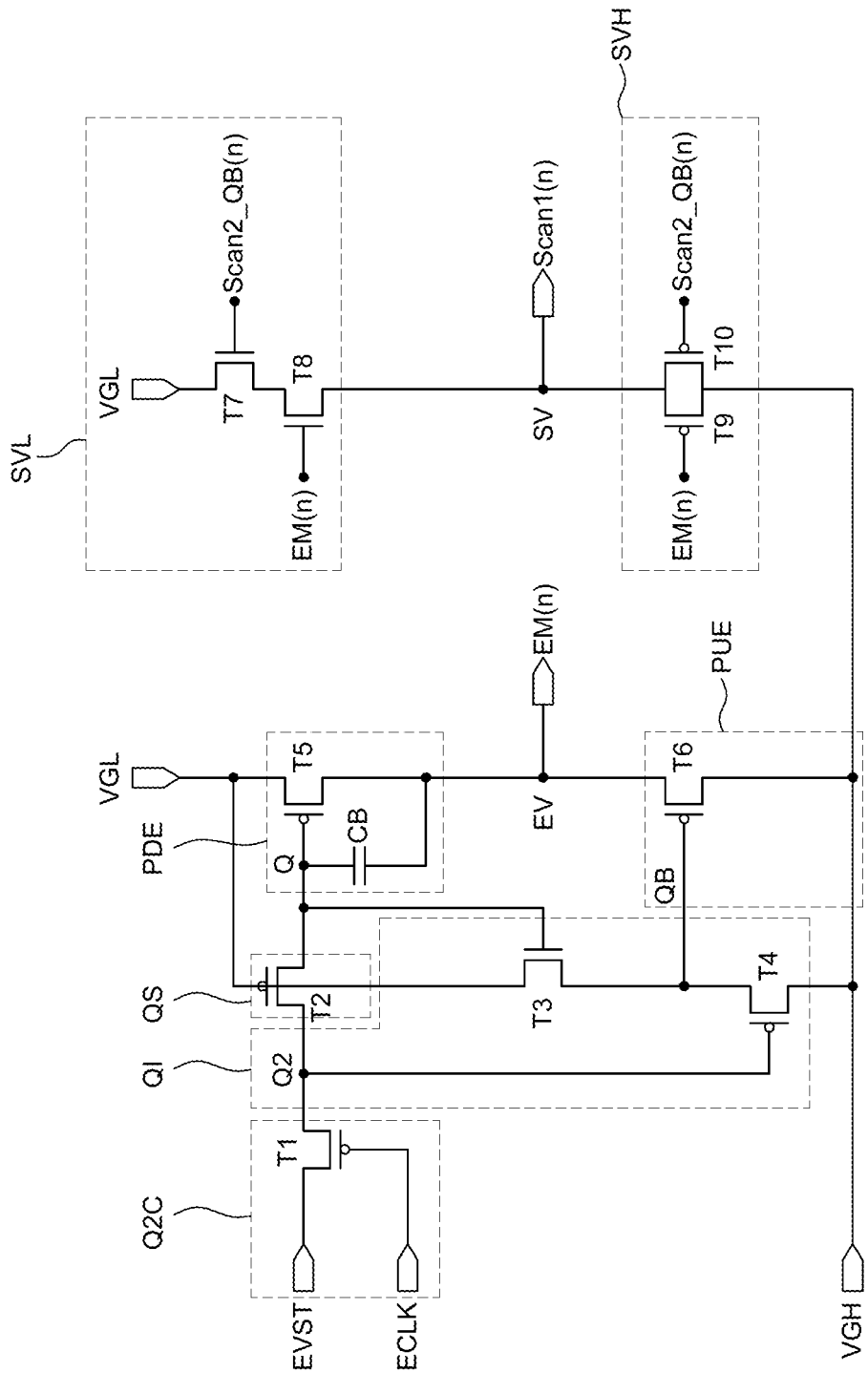
FIG. 5 is a circuit diagram illustrating a gate driving circuit of the electroluminescent display device according to an embodiment of the present disclosure.

FIG. 5 is a circuit diagram illustrating the gate driving circuit GD of the electroluminescent display device 100 according to an embodiment of the present disclosure.

The fourth transistor and the seventh transistor are provided as switching transistors for applying an on-bias stress to the driving transistor of the electroluminescent display device 100 and applying a reset voltage to the anode of the light emitting element, and the first scan signal generating circuit for providing the first scan signal Scan1(n) that controls the fourth transistor and the seventh transistor may be included in a gate driving circuit GD. When a separate first scan signal generating circuit is included in the gate driving circuit GD, a width of the gate driving circuit GD may increase due to the additional circuit. In order to prevent an increase in the width of the gate driving circuit GD, the emission signal generating circuit may be used without separately providing the first scan signal generating circuit.

Accordingly, hereinafter, the emission signal generating circuit EDC(n) that provides the emission signal EM(n) and the first scan signal generating circuit SDC1(n) that provides the first scan signal Scan1(n) using the emission signal generating circuit EDC(n) will be described.

Referring to FIG. 5, the emission signal generating circuit EDC(n) includes a first pull-down unit PDE, a first pull-up unit PUE, a Q node maintenance unit QS, a Q2 node controller Q2C, and a Q node inverter QI. The first pull-down unit PDE may be or include first pull-down circuitry PDE, and may be referred to as first pull-down circuitry PDE. The first pull-up unit PUE may be or include first pull-up circuitry PUE, and may be referred to as first pull-down circuitry PUE. The Q node maintenance unit QS may be or include Q node maintenance circuitry QS, and may be referred to as Q node maintenance circuitry QS. The Q2 node controller Q2C may be or include Q2 node control circuitry Q2C, and may be referred to as Q2 node control circuitry Q2C.

The first pull-down unit PDE outputs the emission signal EM(n) as a turn-on voltage in response to a voltage of a Q node, and the first pull-up unit PUE outputs the emission signal EM(n) as a turn-off voltage in response to a voltage of a QB node. In addition, the emission signal EM(n) determined by the first pull-down unit PDE and the first pull-up unit PUE is provided to the n-th pixel line PG(n). The QB node to which the first pull-up unit PUE is coupled, labeled "QB" in FIG. 5, may also be referred to as a "first QB node."

The Q node maintenance unit QS is connected between the Q node and a Q2 node and serves as a buffer preventing a sudden change in voltage applied to the Q node. The Q node maintenance unit QS continuously electrically connects the Q node and the Q2 node. Accordingly, a voltage of the Q2 node maintains the same state as a voltage of the Q node. As an example, the Q node maintenance unit QS may electrically connect the Q node inverter QI and the Q node.

The Q2 node controller Q2C is a component for charging or discharging the Q2 node, and applies a turn-on voltage or a turn-off voltage to the Q2 node using a start signal EVST. In the emission signal generating circuit EDC(n) provided to the n-th pixel line, when n is a natural number greater than or equal to 2, the Q2 node controller Q2C may use an output signal EM(n-1) of an (n-1)-th emission signal generating circuit EDC(n-1) as a start signal.

The Q node inverter QI is a component for charging or discharging the QB node by inverting the voltage of the Q node. The Q node inverter QI applies a turn-on voltage or a turn-off voltage to the QB node according to a Q2 node voltage that is applied by the Q2 node controller Q2C.

The first scan signal generating circuit SDC1($n$) includes a second pull-down unit SVL and a second pull-up unit SVH. The second pull-down unit SVL may be or include second pull-down circuitry SVL, and may be referred to as second pull-down circuitry SVL. The second pull-up unit SVH may be or include second pull-up circuitry SVH, and may be referred to as second pull-up circuitry SVH.

The second pull-down unit SVL outputs the first scan signal Scan1($n$) as a turn-on voltage in response to an output signal EM(n) of the emission signal generating circuit EDC(n) and a voltage of a QB node of the second scan signal generating circuit Scan2_QB(n). The second pull-up unit SVH outputs the first scan signal Scan1($n$) as a turn-off voltage in response to the output signal EM(n) of the emission signal generating circuit EDC(n) and the voltage of the QB node of the second scan signal generating circuit Scan2_QB(n). The second pull-down unit SVL is implemented with n-type transistors, and the second pull-up unit SVH is implemented with p-type transistors. In addition, the second pull-down unit SVL is implemented by connecting transistors in series, and the second pull-up unit SVH is implemented by connecting transistors in parallel. The first scan signal Scan1($n$) determined by the second pull-down unit SVL and the second pull-up unit SVH is provided to the n-th pixel line PG(n). The QB node of the second scan signal generating circuit may be referred to as a "second QB node."

Meanwhile, the aforementioned turn-off voltage and turn-on voltage vary depending on a type of the transistor to which the voltage is applied. The turn-off voltage is at a high level for a p-type transistor and is at a low level for an n-type transistor. In addition, the turn-on voltage is at a low level for a p-type transistor and is at a high level for an n-type transistor. The gate signal generating circuit according to the embodiment of the present disclosure includes both an n-type transistor and a p-type transistor. The emission signal EM(n) and the first scan signal Scan1($n$), which are output signals of the gate signal generating circuit, are provided to the pixel circuit included in the n-th pixel line PG(n). A specific circuit structure and operation of the gate signal generating circuit will be described below.

Figure 6:
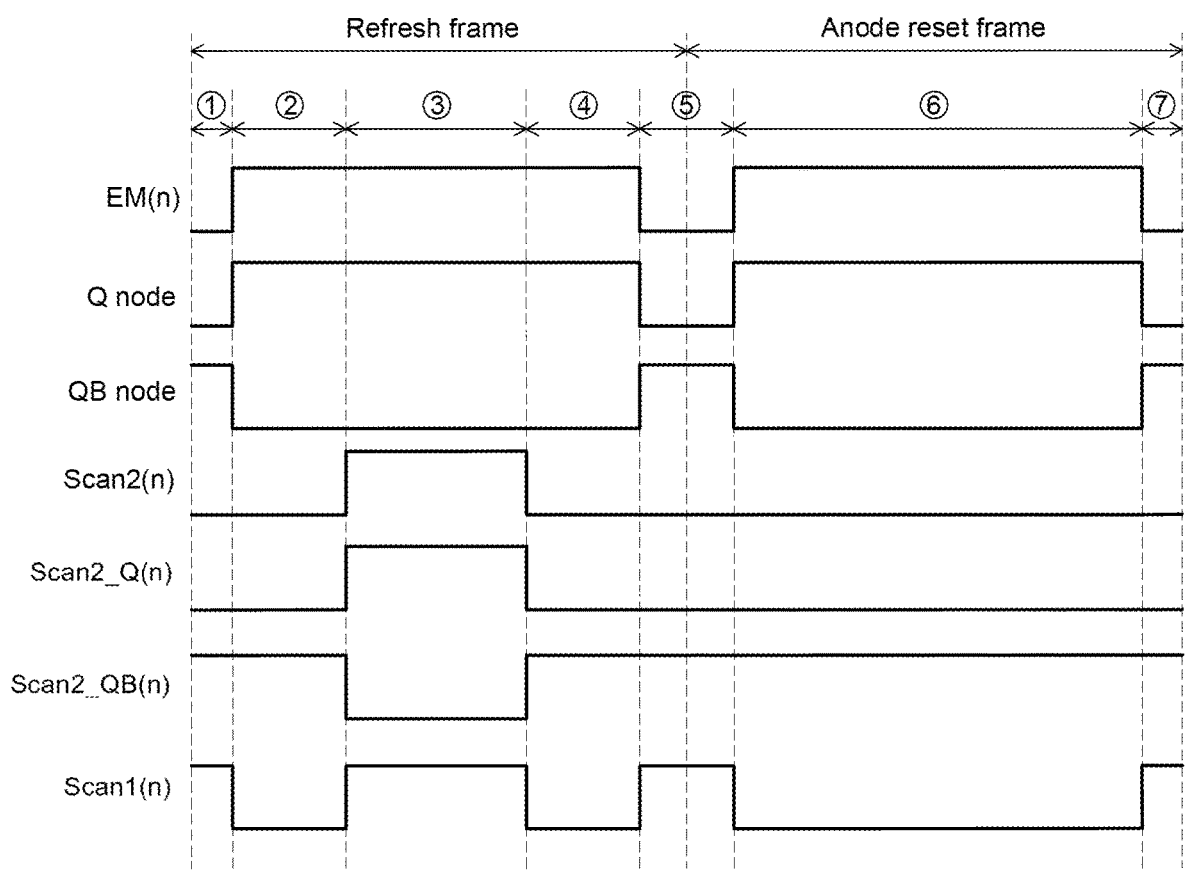
FIG. 6 is a waveform diagram of signals provided to the gate driving circuit of FIG. 5.
Figure 7A:
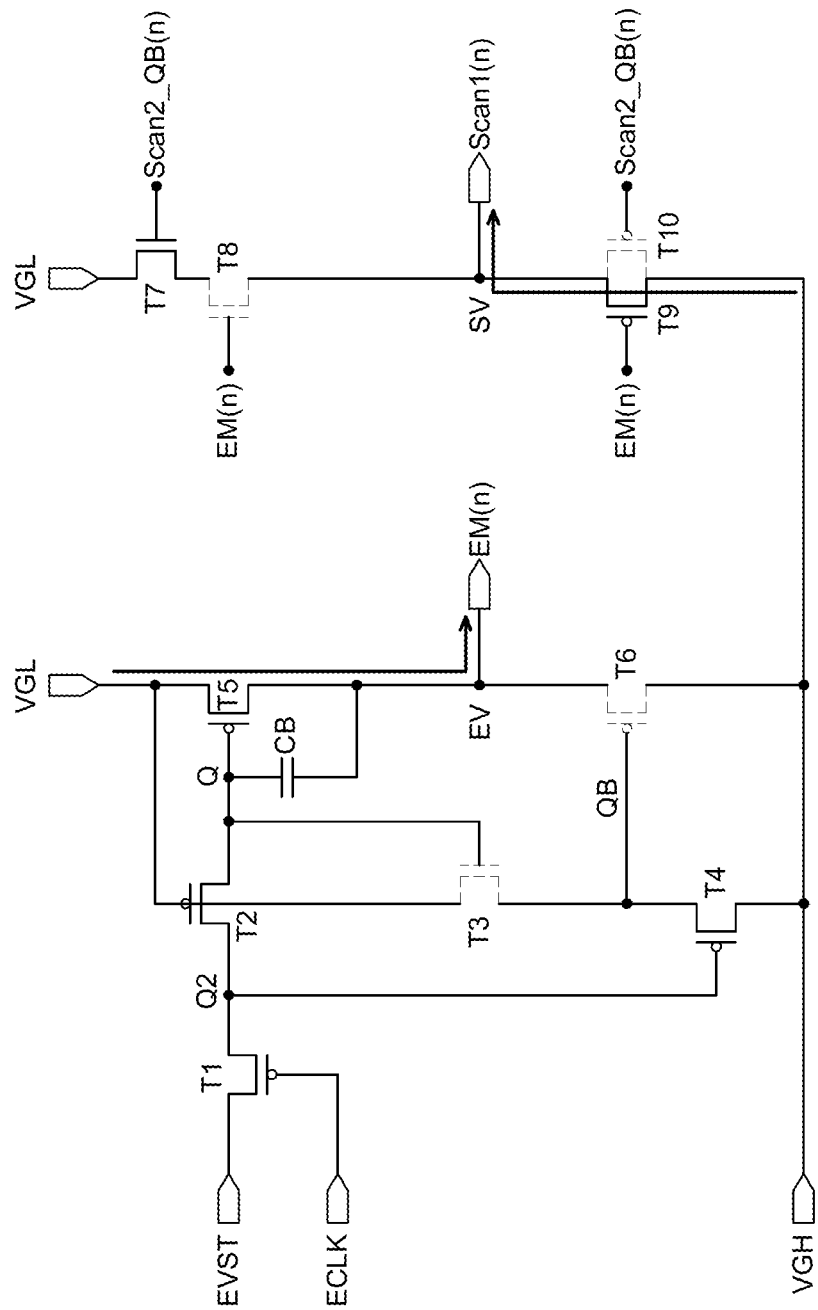
FIG. 7A is a circuit diagram of the gate driving circuit according to an embodiment of the present disclosure during periods ①, ⑤, and ⑦ of FIG. 6.
Figure 7B:
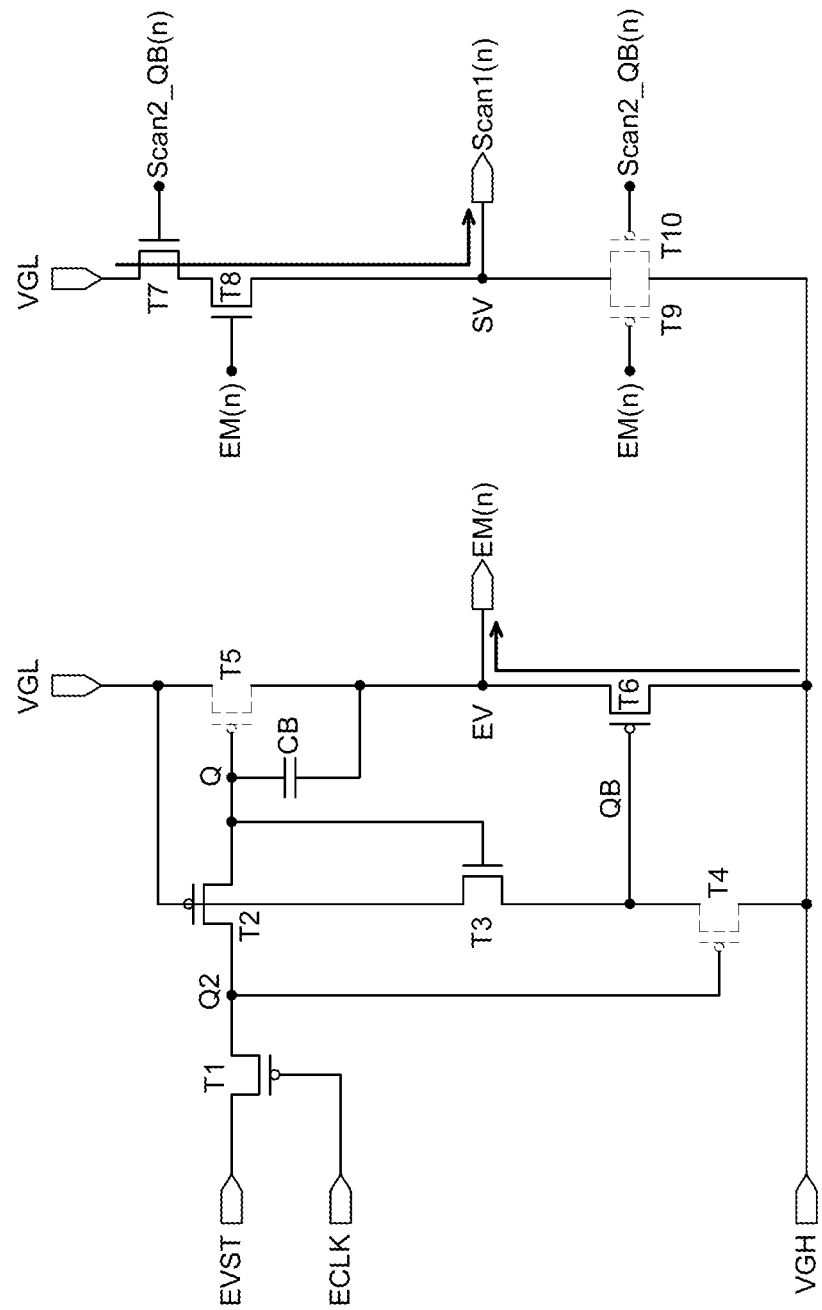
FIG. 7B is a circuit diagram of the gate driving circuit according to an embodiment of the present disclosure during periods ②, ④, and ⑥ of FIG. 6.
Figure 7C:
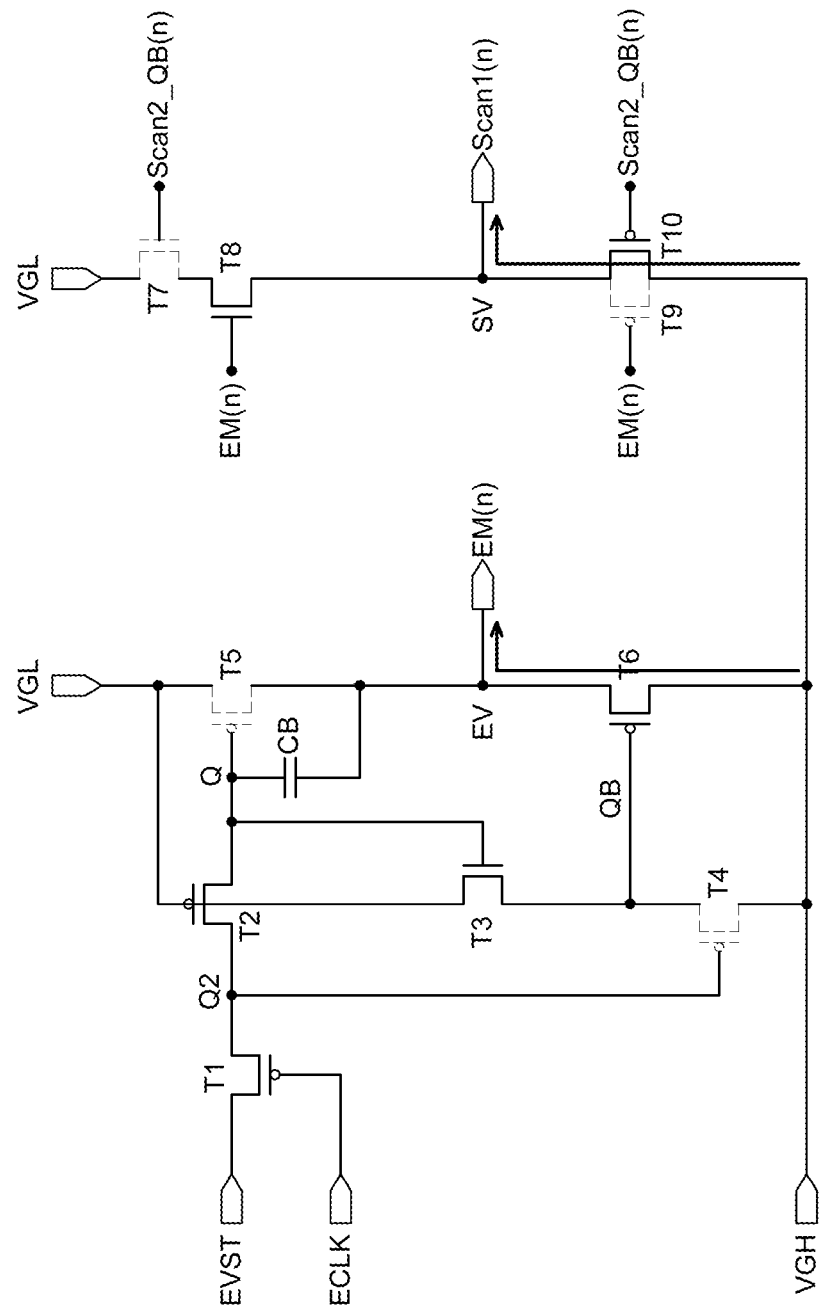
FIG. 7C is a circuit diagram of the gate driving circuit according to an embodiment of the present disclosure during period ③ of FIG. 6.

FIG. 6 is a waveform diagram of signals provided to the gate driving circuit of FIG. 5. FIG. 7A is a circuit diagram of the gate driving circuit according to an embodiment of the present disclosure during periods ①, ⑤, and ⑦ of FIG. 6. FIG. 7B is a circuit diagram of the gate driving circuit according to an embodiment of the present disclosure during periods ②, ④, and ⑥ of FIG. 6. FIG. 7C is a circuit diagram of the gate driving circuit according to an embodiment of the present disclosure during period ③ of FIG. 6. In this case, the gate driving circuit specifically means the gate signal generating circuit.

The diagram of FIG. 6 was prepared based on the waveform diagram of FIG. 4, and in FIG. 4, differences G are present between the emission signal EM(n) and the first scan signal Scan1($n$), and between the first scan signal Scan1($n$) and the (n-3)-th second scan signal Scan2($n$-3). The difference G shown in FIG. 4 is a margin period for preventing overlap between gate signals, and may be 1 horizontal period 1H to 2 horizontal periods 2H, which may not be as shown in the waveform diagram of FIG. 6. And, a difference between the third scan signal Scan3($n$) existing after the sampling period, and the second scan signal Scan2($n$) and the first scan signal Scan1($n$) may be equal to or longer than the period of G, and may be approximately 4 horizontal periods 4H.

As described above, the electroluminescent display device 100 according to an embodiment of the present disclosure may be driven dividedly in a refresh frame and an anode reset frame. In explaining driving of the emission signal generating circuit EDC(n) and the first scan signal generating circuit SDC1($n$), the refresh frame may be divided into periods of ①, ②, ③, ④, and ⑤, and the anode reset frame may be divided into periods of ⑤, ⑥, and ⑦.

FIGS. 5, 6, and 7A show the driving of the emission signal generating circuit EDC(n) and the first scan signal generating circuit SDC1($n$) during the periods ①, ⑤, and ⑦ in which the light emitting element EL emits light. During the periods ①, ⑤, and ⑦, the emission signal generating circuit EDC(n) outputs the emission signal EM(n) of a low level, and the first scan signal generating circuit SDC1($n$) outputs the first scan signal Scan1($n$) of a high level. And, a voltage of the QB node of the second scan signal generating circuit Scan2_QB(n) has a high level voltage. The Scan2_Q (n) in FIG. 6 refers to voltage of the Q node of the second scan signal generating circuit.

In the periods ①, ⑤, and ⑦ of the refresh frame and the anode reset frame, the Q2 node controller Q2C provides a low level voltage to the Q2 node. The Q2 node controller Q2C is controlled by a clock signal ECLK and provides the start signal EVST or an emission signal EM(n-1) of a previous row to the Q2 node. The Q2 node controller Q2C may be implemented as a first transistor T1. The first transistor T1 may be a p-type MOSFET (PMOS) and may be implemented as a low-temperature polycrystalline silicon (LTPS) thin film transistor. The first transistor T1 has a source electrode and a drain electrode that are connected to a line to which the start signal EVST or the emission signal EM(n-1) of the previous row is provided, and the Q2 node, respectively, and a gate electrode connected to a line to which the clock signal ECLK is provided. In this case, since the start signal EVST and the clock signal ECLK are at a low level, the Q2 node controller Q2C is turned on and transmits the low level voltage to the Q2 node. And, even when the clock signal ECLK is switched to a high level, the Q2 node maintains the low level.

In the periods ①, ⑤, and ⑦ of the refresh frame and the anode reset frame, the Q node maintenance unit QS electrically connects the Q node and the Q2 node. The Q node maintenance unit QS is controlled by a low voltage VGL and electrically connects the Q node and the Q2 node. The Q node maintenance unit QS may be implemented as a second transistor T2. The second transistor T2 may be a p-type MOSFET (PMOS) and may be implemented as a low-temperature polycrystalline silicon (LTPS) thin film transistor. The second transistor T2 includes a source electrode and a drain electrode that are connected to the Q node and the Q2 node, respectively, and a gate electrode connected to a line to which the low voltage VGL is provided. Since the low voltage VGL is provided to the gate electrode of the second transistor T2, the second transistor T2 maintains a turned-on state all the time, or substantially all the time, and electrically connects the Q node and the Q2 node.

In the periods ①, ⑤, and ⑦ of the refresh frame and the anode reset frame, the first pull-down unit PDE applies the low voltage VGL to a first output node EV. The first pull-down unit PDE is controlled by the Q node and provides the low voltage VGL to the first output node EV. The first pull-down unit PDE may be implemented as a fifth transistor T5 and a Q node capacitor CB. The fifth transistor T5 may be a p-type MOSFET (PMOS) and may be implemented as a low-temperature polycrystalline silicon (LTPS) thin film transistor. The fifth transistor T5 includes a source electrode and a drain electrode that are connected to the line to which the low voltage VGL is provided, and the first output node, respectively, and a gate electrode connected to the Q node. The Q node capacitor CB includes a first electrode connected to the gate electrode of the fifth transistor T5 and a second electrode connected to the drain electrode of the fifth transistor T5. The Q node capacitor CB rapidly applies the low voltage VGL to the first output node EV through a bootstrapping effect, and maintains the voltage of the Q node even if the Q node floats. Since the first output node EV is connected to a line to which the emission signal EM(n) is provided, the emission signal EM(n) provided to the n-th pixel line in the periods ①, ⑤, and ⑦ is the low voltage VGL.

Meanwhile, in the periods ①, ⑤, and ⑦ of the refresh frame and the anode reset frame, the Q node inverter QI inverts the voltage of the Q node and provides it to the QB node, so that the QB node becomes in a high level state. The Q node inverter QI includes a third transistor T3 and a fourth transistor T4. The third transistor T3 may be an n-type MOSFET (NMOS) and may be implemented as an oxide thin film transistor, and the fourth transistor T4 may be a p-type MOSFET (PMOS) and may be implemented as a low-temperature polycrystalline silicon (LTPS) thin film transistor. The third transistor T3 includes a source electrode and a drain electrode that are connected to the line to which the low voltage VGL is provided and the QB node, respectively, and a gate electrode connected to the Q node. The fourth transistor T4 includes a source electrode and a drain electrode that are connected to a line to which a high voltage VGH is provided and the QB node, respectively, and a gate electrode connected to the Q2 node. The third transistor T3 is turned off by the low level of the Q node, and the fourth transistor T4 is turned on by the low level of the Q2 node. The turned-on fourth transistor T4 applies the high voltage VGH to the QB node. That is, in the periods ①, ⑤, and ⑦, the Q node is at a low level, and the QB node becomes at a high level by the Q node inverter QI.

In the periods ①, ⑤, and ⑦ of the refresh frame and the anode reset frame, the first pull-up unit PUE is controlled by the QB node and does not apply the high voltage VGH to the first output node EV. The first pull-up unit PUE may be implemented as a sixth transistor T6. The sixth transistor T6 may be a p-type MOSFET (PMOS), and may be implemented as a low-temperature polycrystalline silicon (LTPS) thin film transistor. The sixth transistor T6 includes a source electrode and a drain electrode that are connected to the line to which the high voltage VGH is provided, and the first output node EV, respectively, and a gate electrode connected to the QB node. The first pull-up unit PUE is blocked by the high voltage VGH of the QB node and does not apply the high voltage VGH to the first output node EV.

In the periods ①, ⑤, and ⑦ of the refresh frame and the anode reset frame, the second pull-down unit SVL is controlled by the emission signal EM(n) and the QB node of the second scan signal generating circuit Scan2_QB(n) and does not apply the low voltage VGL to a second output node SV. The second pull-down unit SVL may be implemented as a seventh transistor T7 and an eighth transistor T8. Both the seventh transistor T7 and the eighth transistor T8 may be n-type MOSFETs (NMOS), and may be implemented as oxide thin film transistors. A drain electrode of the seventh transistor T7 and a source electrode of the eighth transistor T8 are connected to each other, and a source electrode of the seventh transistor T7 is connected to a line to which the low voltage VGL is provided, and a gate electrode of the seventh transistor T7 is connected to the QB node of the second scan signal generating circuit Scan2_QB(n). A drain electrode of the eighth transistor T8 is connected to the second output node SV, and a gate electrode of the eighth transistor T8 is connected to a line to which the emission signal EM(n) is provided. The seventh transistor T7 is turned on by the QB node of the second scan signal generating circuit Scan2_QB(n) and provides the low voltage VGL to the source electrode of the eighth transistor T8, and the eighth transistor T8 is turned off by the emission signal EM(n). In the periods ①, ⑤, and ⑦, since the emission signal EM(n) is the low voltage VGL and the QB node of the second scan signal generating circuit Scan2_QB(n) is at a high level, the seventh transistor T7 is turned on, and the eighth transistor T8 is turned off. Accordingly, since the seventh transistor T7 and the eighth transistor T8 constituting the second pull-down unit SVL are connected in series, the second pull-down unit SVL does not apply the low voltage VGL to the second output node SV.

In the periods ①, ⑤, and ⑦ of the refresh frame and anode reset frame, the second pull-up unit SVH is controlled by the emission signal EM(n) and the QB node of the second scan signal generating circuit Scan2_QB(n) and provides the high voltage VGH to the second output node SV. The second pull-up unit SVH may be implemented as a ninth transistor T9 and a tenth transistor T10. Both the ninth transistor T9 and the tenth transistor T10 may be p-type MOSFETs (PMOS), and may be implemented as low-temperature polycrystalline silicon (LTPS) thin film transistors. A source electrode of the ninth transistor T9 and a source electrode of the tenth transistor T10 are both connected to the line to which the high voltage VGH is provided, and a drain electrode of the ninth transistor T9 and a drain electrode of the tenth transistor T10 both are connected to the second output node SV. A gate electrode of the ninth transistor T9 is connected to a line to which the emission signal EM(n) is provided, and a gate electrode of the tenth transistor T10 is connected to a QB node of the second scan signal generating circuit Scan2_QB(n). The ninth transistor T9 is turned on by the emission signal EM(n) and provides the high voltage VGH to the second output node SV, and the tenth transistor T10 is turned off by the QB node of the second scan signal generating circuit Scan2_QB(n). In the periods ①, ⑤, and ⑦, since the emission signal EM(n) is the low voltage VGL and the QB node of the second scan signal generating circuit Scan2_QB(n) is at a high level, the ninth transistor T9 is turned on, and the tenth transistor T10 is turned off. Accordingly, since the ninth transistor T9 and the tenth transistor T10 constituting the second pull-up unit SVH are connected in parallel, the second pull-up unit SVH provides the high voltage VGH to the second output node SV.

The low voltage VGL and the high voltage VGH are used as driving voltages for driving the gate driving circuit, and may be voltages at the same levels as the low level and the high level.

FIGS. 5, 6, and 7B show driving of the emission signal generating circuit EDC(n) and the first scan signal generating circuit SDC1(n) during the periods of ②, ④, and ⑥ in which an on bias voltage is applied to the driving transistor and a reset voltage is applied to the anode. During the periods ②, ④, and ⑥, the emission signal generating circuit EDC(n) outputs the emission signal EM(n) of a high level, and the first scan signal generating circuit SDC1(n) outputs the first scan signal Scan1(n) of a low level. And, the QB node of the second scan signal generating circuit Scan2_QB(n) has a high level voltage.

In the periods ②, ④, and ⑥ of the refresh frame and the anode reset frame, the Q2 node controller Q2C provides a high level voltage to the Q2 node. The Q2 node controller Q2C is controlled by the clock signal ECLK and provides the start signal EVST or the emission signal EM(n-1) of the previous row to the Q2 node. In this case, since the clock signal ECLK is at a low level and the start signal EVST is at a high level, the Q2 node controller Q2C is turned on and transmits the high level to the Q2 node. And, even when the clock signal ECLK is switched to a high level, the Q2 node maintains the high level.

Even in the periods ②, ④, and ⑥ of the refresh frame and the anode reset frame, the Q node maintenance unit QS electrically connects the Q node and the Q2 node.

In the periods ②, ④, and ⑥ of the refresh frame and the anode reset frame, the first pull-down unit PDE is controlled by the Q node and blocks the low voltage VGL. The first pull-down unit PDE is blocked by the high level voltage of the Q node and does not apply the low voltage VGL to the first output node EV.

Meanwhile, in the periods ②, ④, and ⑥ of the refresh frame and the anode reset frame, the Q node inverter QI inverts the voltage of the Q node and provides it to the QB node, so that the QB node becomes in a low level state. The third transistor T3 constituting the Q node inverter QI is turned on by the high level of the Q node, and the fourth transistor T4 is turned off by the high level of the Q2 node. The turned-on third transistor T3 applies the low voltage VGL to the QB node. That is, in the periods ②, ④, and ⑥, the Q node is at a high level, and the QB node becomes at a low level by the Q node inverter QI.

In the periods ②, ④, and ⑥ of the refresh frame and the anode reset frame, the first pull-up unit PUE is controlled by the QB node and transmits the high voltage VGH to the first output node EV. The sixth transistor T6 constituting the first pull-up unit PUE is turned on by the low voltage VGL of the QB node and applies the high voltage VGH to the first output node EV. Since the first output node EV is connected to the line to which the emission signal EM(n) is provided, the emission signal EM(n) provided to the n-th pixel line PG(n) in the periods ②, ④, and ⑥ is the high voltage VGH.

In the periods ②, ④, and ⑥ of the refresh frame and the anode reset frame, the second pull-down unit SVL is controlled by the emission signal EM(n) and the QB node of the second scan signal generating circuit Scan2_QB(n) and applies the low voltage VGL to the second output node SV. The seventh transistor T7 is turned on by the QB node of the second scan signal generating circuit Scan2_QB(n) and provides the low voltage VGL to the source electrode of the eighth transistor T8, and the eighth transistor T8 is turned on by the emission signal EM(n) and applies the low voltage VGL to the second output node SV. In the periods ②, ④, and ⑥, since the emission signal EM(n) is the high voltage VGH, and the QB node of the second scan signal generating circuit Scan2_QB(n) is also at a high level, the seventh transistor T7 and the eighth transistor T8 are turned on. By the seventh transistor T7 and the eighth transistor T8 connected in series, the second pull-down unit SVL applies the low voltage VGL to the second output node SV.

In the periods ②, ④, and ⑥ of the refresh frame and anode reset frame, the second pull-up unit SVH is controlled by the emission signal EM(n) and the QB node of the second scan signal generating circuit Scan2_QB(n) and does not apply the high voltage VGH to the second output node SV. The ninth transistor T9 is turned off by the emission signal EM(n), and the tenth transistor T10 is also turned off by the QB node of the second scan signal generating circuit Scan2_QB(n). In the periods ②, ④, and ⑥, since the emission signal EM(n) is the high voltage VGH and the QB node of the second scan signal generating circuit Scan2_QB (n) is also at a high level, both the ninth transistor T9 and the tenth transistor T10 are turned off. Due to the ninth transistor T9 and the tenth transistor T10 connected in parallel, the second pull-up unit SVH does not apply the high voltage VGH to the second output node SV.

FIGS. 5, 6, and 7C show driving of the emission signal generating circuit EDC(n) and the first scan signal generating circuit SDC1(n) during the period ③ in which the gate electrode of the driving transistor is initialized and the threshold voltage thereof is sampled. During the period ③, the emission signal generating circuit EDC(n) outputs the emission signal EM(n) of a high level, and the first scan signal generating circuit SDC1(n) outputs the first scan signal Scan1(n) of a high level. And, the QB node of the second scan signal generating circuit Scan2_QB(n) has a low level voltage.

In the period ③ of the refresh frame, the Q2 node controller Q2C maintains the high level voltage which is applied to the node Q2 during the period ②. And, since the Q node maintenance unit QS electrically connects the Q node and the Q2 node, the Q2 node is also at a high level.

Even in the period ③ of the refresh frame, the Q node maintenance unit QS electrically connects the Q node and the Q2 node.

In the period ③ of the refresh frame, the first pull-down unit PDE is controlled by the Q node and blocks the low voltage VGL. The first pull-down unit PDE is blocked by the high level voltage of the Q node and does not apply the low voltage VGL to the first output node EV.

Meanwhile, in the period ③ of the refresh frame, the Q node inverter QI inverts the voltage of the Q node and provides it to the QB node, so that the QB node is in a low level state. The third transistor T3 constituting the Q node inverter QI is turned on by the high level of the Q node, and the fourth transistor T4 is turned off by the high level of the Q2 node. The turned-on third transistor T3 applies the low voltage VGL to the QB node. That is, in the period ③, the Q node is at a high level, and the QB node becomes at a low level by the Q node inverter QI.

In the period ③ of the refresh frame, the first pull-up unit PUE is controlled by the QB node and transmits the high voltage VGH to the first output node EV. The sixth transistor T6 constituting the first pull-up unit PUE is turned on by the low voltage VGL of the QB node and applies the high voltage VGH to the first output node EV. Since the first output node EV is connected to the line to which the emission signal EM(n) is provided, the emission signal EM(n) provided to the n-th pixel line PG(n) in the period ③ is the high voltage VGH.

In the period ③ of the refresh frame, the second pull-down unit SVL is controlled by the emission signal EM(n) and the QB node of the second scan signal generating circuit Scan2_QB(n) and does not apply the low voltage VGL to the second output node SV. The seventh transistor T7 is turned off by the QB node of the second scan signal generating circuit Scan2_QB(n), and the eighth transistor T8 is turned on by the emission signal EM(n). In the period ③, since the emission signal EM(n) is the high voltage VGH and the QB node of the second scan signal generating circuit Scan2_QB(n) is at a low level, the seventh transistor T7 is turned off and the eighth transistor T8 is turned on. By the seventh transistor T7 and the eighth transistor T8 connected in series, the second pull-down unit SVL does not apply the low voltage VGL to the second output node SV.

In the period ③ of the refresh frame, the second pull-up unit SVH is controlled by the emission signal EM(n) and the QB node of the second scan signal generating circuit Scan2_QB(n) and applies the high voltage VGH to the second output node SV. The ninth transistor T9 is turned off by the emission signal EM(n), and the tenth transistor T10 is turned on by the QB node of the second scan signal generating circuit Scan2_QB(n). In the period ③, since the emission signal EM(n) is the high voltage VGH and the QB node of the second scan signal generating circuit Scan2_QB(n) is at a low level, the ninth transistor T9 is turned off and the tenth transistor T10 is turned on. By the ninth transistor T9 and the tenth transistor T10 connected in parallel, the second pull-up unit SVH applies the high voltage VGH to the second output node SV.

Since the second output node SV is connected to a line to which the first scan signal Scan1(n) is provided, the first scan signal Scan1(n) provided to the n-th pixel line PG(n) in the period ③ is the high voltage VGH.

The embodiments of the present disclosure can also be described as follows:

According to an embodiment of the present disclosure, there is provided an electroluminescent display device. The electroluminescent display device includes a pixel circuit implemented with a plurality of transistors and a gate driving circuit providing an emission signal, a first scan signal, and a second scan signal to the pixel circuit. The gate driving circuit includes an emission signal generating circuit for applying the emission signal to a gate electrode of at least one of the plurality of transistors, a first scan signal generating circuit for applying the first scan signal to a gate electrode of at least one of the plurality of transistors, and a second scan signal generating circuit for applying the second scan signal to a gate electrode of at least one of the plurality of transistors. The first scan signal generating circuit receives the emission signal and a voltage of a second QB node of the second scan signal generating circuit. The emission signal generating circuit and the first scan signal generating circuit include an n-type transistor and a p-type transistor.

The emission signal generating circuit may include a first pull-down unit controlled by a Q node, a first pull-up unit controlled by a first QB node, and a Q node inverter connected to the first QB node and configured to invert a voltage of the Q node.

The first scan signal generating circuit may include a second pull-up unit and a second pull-down unit. Each of the second pull-up unit and the second pull-down unit may be controlled by the emission signal and the voltage of the second QB node of the second scan signal generating circuit.

The second pull-up unit may include p-type transistors connected in parallel, and the second pull-down unit may include n-type transistors connected in series.

The plurality of transistors may include at least one n-type transistor and at least one p-type transistor.

The first scan signal generating circuit may be connected to a gate electrode of the at least one p-type transistor.

The second scan signal generating circuit may be connected to a gate electrode of the at least one n-type transistor.

The emission signal generating circuit may be connected to a gate electrode of the at least one p-type transistor.

The first scan signal generating circuit and the emission signal generating circuit may be shared in an odd-numbered pixel circuit and an even-numbered pixel circuit.

According to another embodiment of the present disclosure, there is provided a gate driving circuit. The gate driving circuit includes a first pull-down unit controlled by a Q node, a first pull-up unit controlled by a first QB node, a second pull-down unit controlled by an emission signal and a second QB node of a second scan signal generating circuit, a second pull-up unit controlled by the emission signal and the second QB node of the second scan signal generating circuit, and a Q node inverter electrically connected to the Q node and the first QB node and configured to invert a voltage of the Q node. The first pull-down unit and the first pull-up unit output the emission signal. The second pull-down unit and the second pull-up unit output a first scan signal.

The gate driving circuit may further include a Q node maintenance unit electrically connecting the Q node inverter and the Q node.

The Q node maintenance unit may be controlled by a low voltage and electrically connect the Q node and a Q2 node. The Q node inverter may include an n-type transistor controlled by the Q node and a p-type transistor controlled by the Q2 node.

The gate driving circuit may further include a Q2 node controller connected to the Q2 node. The Q2 node controller may be controlled by a clock signal and provide a start signal or an emission signal output from a previous row to the Q2 node.

The second pull-down unit may include n-type transistors connected in series.

The second pull-down unit may be connected to a line to which a low voltage is provided.

The second pull-up unit may include p-type transistors connected in parallel.

The second pull-up unit may be connected to a line to which a high voltage is provided.

The first pull-down unit may include a p-type transistor and a capacitor connecting a gate electrode of the p-type transistor and a drain electrode or a source electrode of the p-type transistor.

The first pull-down unit may be connected to a line to which a low voltage is provided. The first pull-up unit may be connected to a line to which a high voltage is provided.

When the second QB node of the second scan signal generating circuit has a low level voltage, the first scan signal and the emission signal may be a high level voltage.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
    a pixel circuit implemented with a plurality of transistors; and
    a gate driving circuit providing an emission signal, a first scan signal, and a second scan signal to the pixel circuit,
    wherein the gate driving circuit includes:
        an emission signal generating circuit for applying the emission signal to a gate electrode of at least one of the plurality of transistors;
        a first scan signal generating circuit for applying the first scan signal to a gate electrode of at least one of the plurality of transistors; and
        a second scan signal generating circuit for applying the second scan signal to a gate electrode of at least one of the plurality of transistors,
    wherein the first scan signal generating circuit receives the emission signal from the emission signal generating circuit and a voltage of a second QB node of the second scan signal generating circuit,
    wherein the emission signal generating circuit and the first scan signal generating circuit include an n-type transistor and a p-type transistor.

2. The electroluminescent display device of claim 1, wherein the emission signal generating circuit includes,
    a first pull-down unit controlled by a Q node;
    a first pull-up unit controlled by a first QB node; and
    a Q node inverter connected to the first QB node and configured to invert a voltage of the Q node.

3. The electroluminescent display device of claim 1, wherein the first scan signal generating circuit includes a second pull-up unit and a second pull-down unit,
    wherein each of the second pull-up unit and the second pull-down unit is controlled by the emission signal and the voltage of the second QB node of the second scan signal generating circuit.

4. The electroluminescent display device of claim 3, wherein the second pull-up unit includes p-type transistors connected in parallel, and the second pull-down unit includes n-type transistors connected in series.

5. The electroluminescent display device of claim 1, wherein the plurality of transistors include at least one n-type transistor and at least one p-type transistor.

6. The electroluminescent display device of claim 5, wherein the first scan signal generating circuit is connected to a gate electrode of the at least one p-type transistor.

7. The electroluminescent display device of claim 5, wherein the second scan signal generating circuit is connected to a gate electrode of the at least one n-type transistor.

8. The electroluminescent display device of claim 5, wherein the emission signal generating circuit is connected to a gate electrode of the at least one p-type transistor.

9. The electroluminescent display device of claim 1, wherein the first scan signal generating circuit and the emission signal generating circuit are shared in an odd-numbered pixel circuit and an even-numbered pixel circuit.

10. A gate driving circuit, comprising:
    a first pull-down unit controlled by a Q node;
    a first pull-up unit controlled by a first QB node;
    a second pull-down unit controlled by an emission signal and a second QB node of a second scan signal generating circuit;
    a second pull-up unit controlled by the emission signal and the second QB node of the second scan signal generating circuit; and
    a Q node inverter electrically connected to the Q node and the first QB node and configured to invert a voltage of the Q node,
    wherein the first pull-down unit and the first pull-up unit output the emission signal,
    wherein the second pull-down unit and the second pull-up unit output a first scan signal.

11. The gate driving circuit of claim 10, further comprising: a Q node maintenance unit electrically connecting the Q node inverter and the Q node.

12. The gate driving circuit of claim 11, wherein the Q node maintenance unit is controlled by a low voltage and electrically connects the Q node and a Q2 node,
    wherein the Q node inverter includes an n-type transistor controlled by the Q node and a p-type transistor controlled by the Q2 node.

13. The gate driving circuit of claim 12, further comprising: a Q2 node controller connected to the Q2 node,
    wherein the Q2 node controller is controlled by a clock signal and provides a start signal or an emission signal output from a previous row to the Q2 node.

14. The gate driving circuit of claim 10, wherein the second pull-down unit includes n-type transistors connected in series.

15. The gate driving circuit of claim 14, wherein the second pull-down unit is connected to a line to which a low voltage is provided.

16. The gate driving circuit of claim 10, wherein the second pull-up unit includes p-type transistors connected in parallel.

17. The gate driving circuit of claim 16, wherein the second pull-up unit is connected to a line to which a high voltage is provided.

18. The gate driving circuit of claim 10, wherein the first pull-down unit includes a p-type transistor and a capacitor connecting a gate electrode of the p-type transistor and a drain electrode or a source electrode of the p-type transistor.

19. The gate driving circuit of claim 10, wherein the first pull-down unit is connected to a line to which a low voltage is provided, wherein the first pull-up unit is connected to a line to which a high voltage is provided.

20. The gate driving circuit of claim 10, wherein when the second QB node of the second scan signal generating circuit has a low level voltage, the first scan signal and the emission signal are a high level voltage.

* * * * *